United States Patent
Cha et al.

(10) Patent No.: US 8,614,394 B2
(45) Date of Patent: Dec. 24, 2013

(54) P-N ZINC OXIDE NANOWIRES AND METHODS OF MANUFACTURING THE SAME

(75) Inventors: Seung-nam Cha, Seoul (KR); Byong-gwon Song, Seoul (KR); Jae-eun Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 372 days.

(21) Appl. No.: 12/656,003

(22) Filed: Jan. 13, 2010

(65) Prior Publication Data

US 2010/0193015 A1  Aug. 5, 2010

(30) Foreign Application Priority Data

Jan. 30, 2009 (KR) .................. 10-2009-0007389

(51) Int. Cl.
*H01L 31/00* (2006.01)
*H01L 21/00* (2006.01)

(52) U.S. Cl.
USPC .............. 136/252; 438/85; 438/98; 977/762

(58) Field of Classification Search
USPC ................ 136/252; 977/762; 438/85, 98
See application file for complete search history.

(56) References Cited

U.S. PATENT DOCUMENTS

| | | | | |
|---|---|---|---|---|
| 4,479,027 A * | 10/1984 | Todorof | ........................ | 136/249 |
| 6,100,465 A * | 8/2000 | Shinohara et al. | ............ | 136/258 |
| 6,527,858 B1 * | 3/2003 | Yoshida et al. | ............... | 117/108 |
| 7,235,129 B2 | 6/2007 | Chen | | |
| 2002/0037249 A1 * | 3/2002 | Konakahara et al. | ......... | 423/592 |
| 2006/0189018 A1 * | 8/2006 | Yi et al. | ........................... | 438/47 |
| 2007/0235738 A1 * | 10/2007 | Jin et al. | .......................... | 257/79 |
| 2009/0050198 A1 * | 2/2009 | Mueller et al. | ................. | 136/252 |
| 2009/0321738 A1 * | 12/2009 | Kim et al. | ....................... | 257/59 |

FOREIGN PATENT DOCUMENTS

| | | |
|---|---|---|
| KR | 10-2005-0001582 | 1/2005 |
| KR | 10-2006-0024198 | 3/2006 |
| KR | 10-2006-0042011 | 5/2006 |
| KR | 10-2006-0093642 | 8/2006 |
| WO | WO 2007099138 A1 * | 9/2007 |

OTHER PUBLICATIONS

Park et al., Applied Physics Letters, vol. 82, No. 6, 964-966 (2003).*
Xiang et al., Nano Letters, vol. 7, No. 2, 323-328 (2007).*
Jeong et al., Applied Physics Letters, vol. 88, 202105 (2006).*
Kyoung-Kook Kim, et al., "Realization of p-type ZnO thin films via phosphorous doping and thermal activation of the dopant." Jul. 2003. Applied Physics Letters, vol. 83, No. 1.
Y.W. Heo, et al. "p-type behavior in phosphorous-hoped (Zn, Mg)O device structures." May 3, 2004. Applied Physics Letters, Volume 84, No. 18.
H.S. Kim, et al. "Behavior of rapid thermal annealed ZnO:P films grown by pulsed laser deposition." 2007. Journal of Applied Physics 102, 104904-1.

* cited by examiner

*Primary Examiner* — Eli Mekhlin
(74) *Attorney, Agent, or Firm* — Harness, Dickey & Pierce, P.L.C.

(57) ABSTRACT

Disclosed are p-n zinc (Zn) oxide nanowires and a methods of manufacturing the same. A p-n Zn oxide nanowire includes a p-n junction structure in which phosphorus (P) is on a surface of a Zn oxide nanowire.

17 Claims, 7 Drawing Sheets

P-N ZINC OXIDE NANOWIRES AND METHODS OF MANUFACTURING THE SAME

CROSS-REFERENCE TO RELATED APPLICATION(S)

This application claims priority under 35 U.S.C. §119 to Korean Patent Application No. 10-2009-0007389, filed on Jan. 30, 2009, in the Korean Intellectual Property Office (KIPO), the entire contents of which is incorporated herein by reference.

BACKGROUND

1. Field

Example embodiments of the present invention relate to p-n nanowires and methods of manufacturing the same, and more particularly, to p-n zinc (Zn) oxide nanowires having phosphorus (P) on a surface of a Zn oxide nanowire, and methods of manufacturing the same.

2. Description of the Related Art

Nanowires currently attract attention in various fields and research is being actively conducted in the field of electronic devices, optical applications such as a light emitting diode (LED) and solar batteries, and complementary metal-oxide semiconductors (CMOS).

In general, a semiconductor material may be mainly n-type and/or p-type and an application of a material may be determined according to the type to which the material is realized. As representative semiconductor materials, silicon (Si) and gallium nitride (GaN) may be easily realized as n-type and/or p-type and thus are being used in various fields.

Zinc (Zn) oxide is a group II-VI oxide semiconductor material, has a wide direct band gap of about 3.37 eV and an excitation binding energy of about 60 mV. Zinc oxide thus attracts attention in various fields of semiconductor devices and optical devices. Zn oxide is generally realized as an n-type material and is not easily realized as a p-type material. Research is being conducted on a method of realizing Zn oxide as a p-type material by doping nitrogen (N) on the Zn oxide.

SUMMARY

Example embodiments may include p-n zinc (Zn) oxide nanowires. A p-n zinc (Zn) oxide nanowire includes phosphorus (P) on a surface of a Zn oxide nanowire. Example embodiments include a method of manufacturing p-n Zn oxide nanowires. A p-n Zn oxide nanowire may be formed by adding P to a surface of a Zn oxide nanowire.

According to example embodiments, a p-n zinc (Zn) oxide nanowire may include an n-type Zn oxide nanowire; and p-type Zn oxide on a surface of the n-type Zn oxide nanowire, the p-type Zn oxide including Zn oxide doped with phosphorus (P). The p-type Zn oxide may have a structure that is at least one of bumps or dots. The p-n Zn oxide nanowire may include a substrate; and a Zn oxide layer on the substrate, the n-type Zn oxide nanowire on and perpendicular to the Zn oxide layer. A P layer may be on the n-type Zn oxide nanowire and the p-type Zn oxide. A transparent electrode may be on the P layer and may be indium tin oxide (ITO). The p-n Zn oxide nanowire may be in a Core-Shell structure. According to example embodiments, a nanowire solar cell may include a p-n Zn oxide nanowire.

According to example embodiments, a method of manufacturing a p-n zinc (Zn) oxide nanowire may include forming a Zn oxide layer on a substrate; forming a Zn oxide nanowire on the Zn oxide layer; and forming p-type Zn oxide on a surface of the Zn oxide nanowire. The method may further include forming a seed layer on the substrate by coating Zn on the substrate; and forming the Zn oxide layer using the seed layer. The forming of the Zn oxide nanowire may include growing the Zn oxide nanowire on a surface of the Zn oxide layer in a vertical direction by heating a Zn oxide source in a chamber. The forming of the p-type Zn oxide on the surface of the Zn oxide nanowire may include forming the p-type Zn oxide by doping the surface of the Zn oxide nanowire with phosphorus (P) by heating a P source in the chamber. The P source may include $P_2O_5$ and may be heated by a heating unit that is independent from a heating unit of the chamber.

The Zn oxide nanowire and the p-type Zn oxide may be formed by using a thermal chemical vapor deposition (TCVD) method. The Zn oxide source may be about 10 mm to about 50 mm from the substrate. The forming of the Zn oxide layer may include performing at least one heat treatment on the seed layer. The at least one heat treatment may be performed at about 400° C. in an oxygen-containing atmosphere for about 40 minutes. The Zn oxide source may be ZnO:C in a 1:1 ratio. The P source may be heated to about 600° C. for about 2 minutes to about 2 hours.

BRIEF DESCRIPTION OF THE DRAWINGS

Example embodiments will be more clearly understood from the following brief description taken in conjunction with the accompanying drawings. FIGS. 1-6 represent non-limiting, example embodiments as described herein.

FIG. 1 is a cross-sectional diagram of a p-n zinc (Zn) oxide nanowire according to example embodiments;

FIG. 3 is a schematic diagram of a thermal chemical vapor deposition (TCVD) system for manufacturing the p-n Zn oxide nanowire illustrated in FIG. 2C;

FIG. 6 is a cross-sectional diagram of a solar cell using p-n Zn oxide nanowires according to example embodiments.

Figure 1:
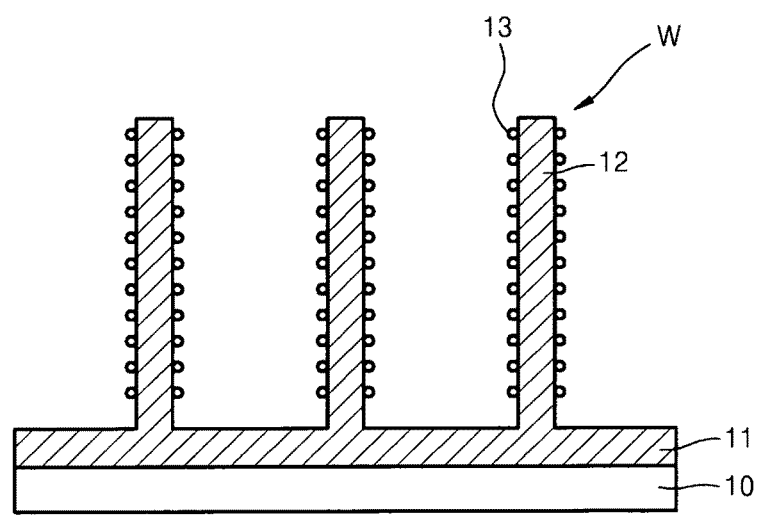

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 6:
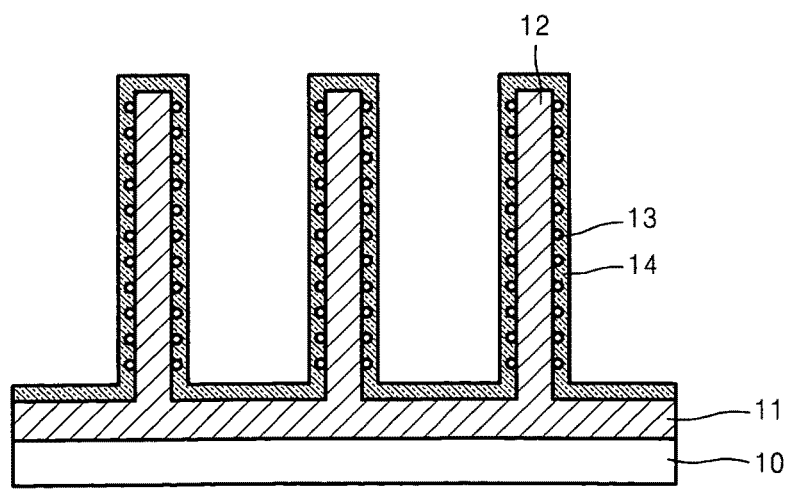

FIG. 1 is a cross-sectional diagram of a p-n zinc (Zn) oxide nanowire W according to example embodiments. Referring to FIG. 1, a Zn oxide layer 11 may be on a substrate 10 and a Zn oxide nanowire 12 may be on the Zn oxide layer 11 in a vertical direction. The Zn oxide nanowire 12 may be n-type. P-type Zn oxide 13 may be on a surface of the Zn oxide nanowire 12 in the form of bumps or dots, by doping Zn oxide with phosphorus (P). The p-n Zn oxide nanowire W may have a heterostructure that is a core-shell structure in which the n-type Zn oxide nanowire 12 is in a core region and the p-type Zn oxide 13 on which P is doped is in a shell region. Referring to FIG. 6, a P layer 14 may be on the n-type Zn oxide nanowire 12 and the p-type Zn oxide 13 of the p-n Zn oxide nanowire W. Although example embodiments are described with reference to an n-type Zn oxide nanowire 12 with P-type Zn oxide 13 on a surface of the nanowire, example embodiments include a P-type ZnO nanowire as the core region with n-type ZnO on a surface of the nanowire as the shell region.

Figure 2A:
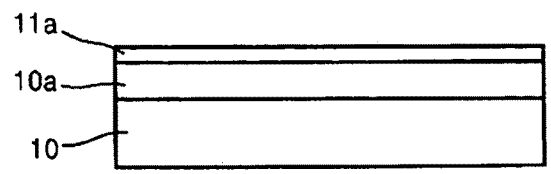
FIGS. 2A-2C are cross-sectional diagrams for describing methods of manufacturing p-n Zn oxide nanowires according to example embodiments.
Figure 2B:
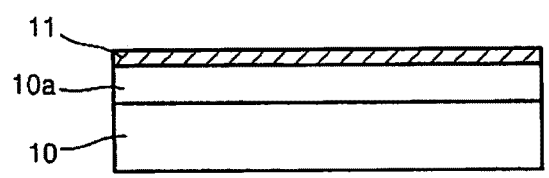
Figure 2C:
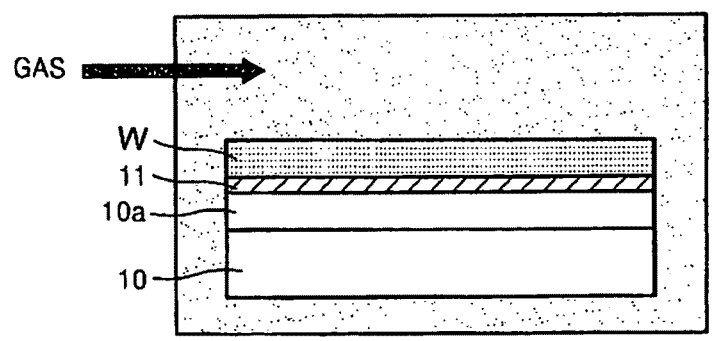

FIGS. 2A-2C are diagrams for describing methods of manufacturing p-n Zn oxide nanowires W according to example embodiments. Referring to FIG. 2A, a substrate 10 may be prepared. The substrate 10 may be formed of a material that is generally used in a semiconductor process (e.g., silicon (Si) or glass). If the substrate 10 is formed of Si, a Si oxide layer 10a may be formed on a surface of the substrate 10. A seed layer 11a may be formed on the substrate 10 (e.g., Zn). The seed layer 11a may be coated on the substrate 10 to a thickness of about several nanometers (nm) to about several tens of nm. Referring to FIG. 2B, a Zn oxide layer 11 may be formed by performing one or more heat treatments on the seed layer 11a. For example, a heat treatment may be performed at about 400° C. under an oxygen-containing atmosphere for about 40 minutes. Referring to FIG. 2C, p-n Zn oxide nanowire W may be grown on the Zn oxide layer 11 by using, for example, a thermal chemical vapor deposition (TCVD) method, which will now be described in detail with reference to FIG. 3.

Figure 3:
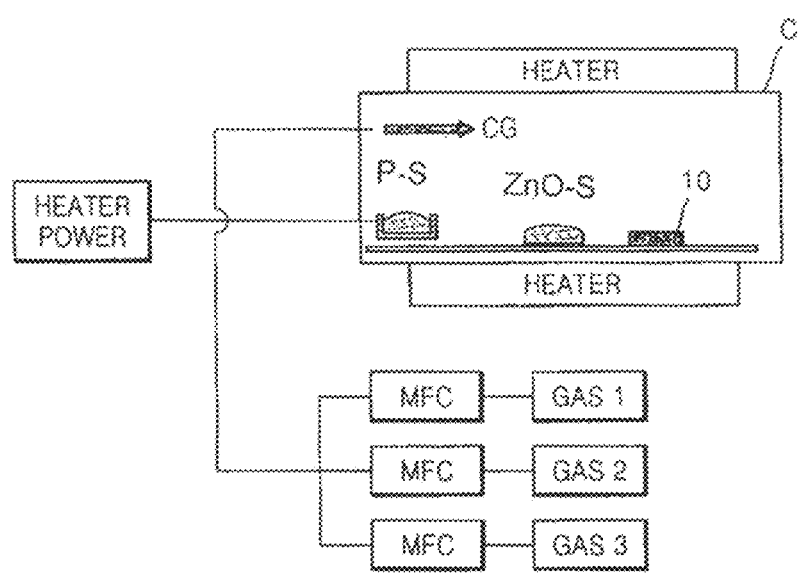

FIG. 3 is a schematic diagram of a thermal chemical vapor deposition (TCVD) system for manufacturing the p-n Zn oxide nanowire W illustrated in FIG. 2C. Referring to FIG. 3, the substrate 10 may be prepared and a Zn oxide source ZnO-S (e.g., ZnO:C=1:1) and a P source P-S (e.g., a P oxide, for example $P_2O_5$) may be included in a chamber C. A heater HEATER may be set to heat the chamber C. The P source P-S may be included in a furnace connected to a heater power supply HEATER POWER that is independent from the heater HEATER. The P source P-S may be heated by an independent heating unit that is different than the heating unit of the chamber C. A gas supply path may be set to provide GAS 1, GAS 2 and GAS 3, for example, a carrier gas (CG) into the chamber C. Mass flow controllers MFC may be used to control the flow of GAS 1, GAS 2 and GAS 3.

Referring to FIGS. 1, 2C and 3, the Zn oxide source ZnO-S may be located at a distance (e.g., from about 10 mm to about 50 mm) from the substrate 10. The heater HEATER may heat the Zn oxide source ZnO-S in the chamber C. A Zn oxide nanowire 12 may grow on the Zn oxide layer 11 of the substrate 10. As the Zn oxide nanowire 12 starts to grow, the heater power supply HEATER may heat the P source P-S to about 600° C. The above condition may be maintained for from about several minutes to about several hours. P may be deposited on a surface of the Zn oxide nanowire 12 and a p-n Zn oxide nanowire W may be formed. An internal portion of the p-n Zn oxide nanowire W may be formed of n-type Zn oxide and a surface portion of the Zn oxide nanowire may be deposited and doped with P so as to form p-type Zn oxide 13, forming the p-n Zn oxide nanowire W in a core-shell structure. After the p-n Zn oxide nanowire W is completely formed, the chamber C may be cooled to room temperature.

The TCVD method may be more economical and/or improved over a metal organic chemical vapor deposition (MOCVD) method. P used to form a p-type Zn oxide may maintain a stable coupling with a Zn oxide nanowire at high and/or increased temperature.

Figure 4A:
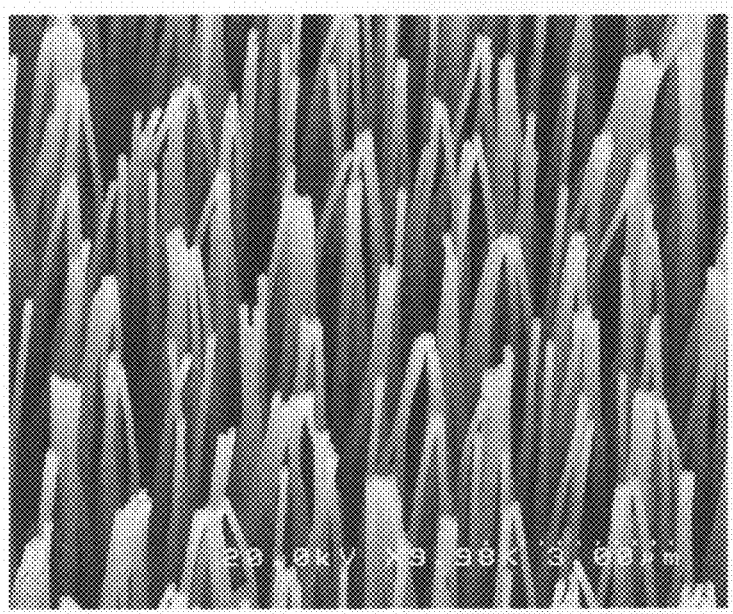
FIG. 4A is a scanning electron microscopic (SEM) image of p-n Zn oxide nanowires formed on a Zn oxide layer.
Figure 4B:
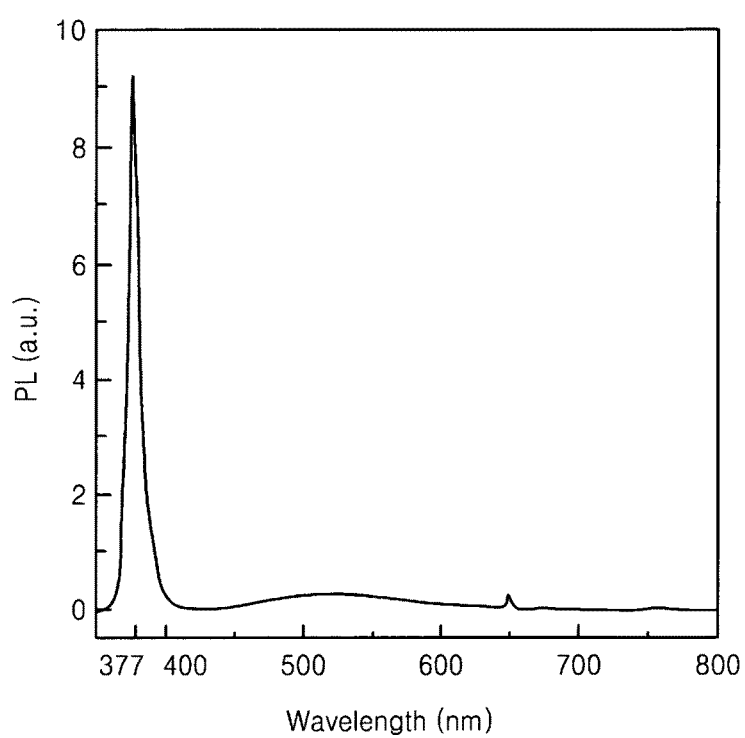
FIG. 4B is a graph showing a photoluminescence (PL) spectrum analysis result of the p-n Zn oxide nanowires illustrated in FIG. 4A.

Analysis results of samples that may be achieved using the above-described method will now be described. FIG. 4A is a scanning electron microscopic (SEM) image of p-n Zn oxide nanowires formed on a Zn oxide layer. Referring to FIG. 4A, the p-n Zn oxide nanowires may be oriented in a vertical direction. FIG. 4B is a graph showing a photoluminescence (PL) spectrum analysis result of the p-n Zn oxide nanowires illustrated in FIG. 4A. Referring to FIG. 4B, a peak occurs at a wavelength of about 377 nm. The peak is a general bulk Zn oxide peak and may demonstrate that the p-n Zn oxide nanowires are formed.

Figure 5A:
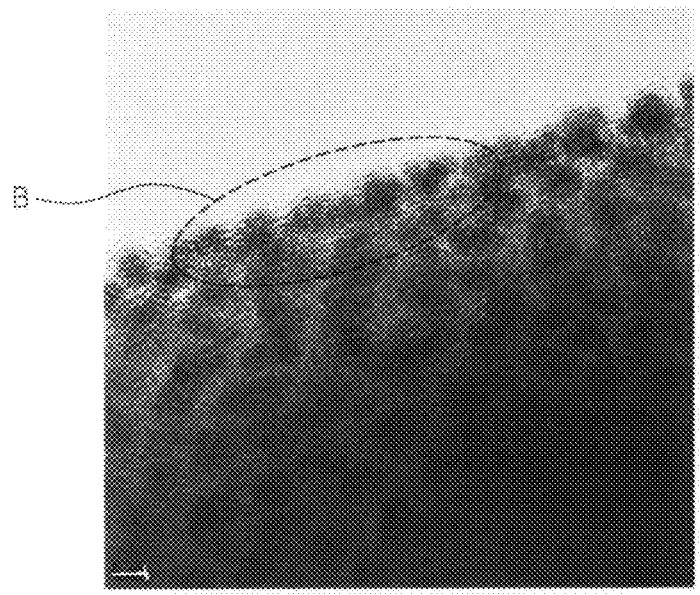
FIGS. 5A and 5B are transmission electron microscopic (TEM) images of portions of a p-n Zn oxide nanowire.
Figure 5B:
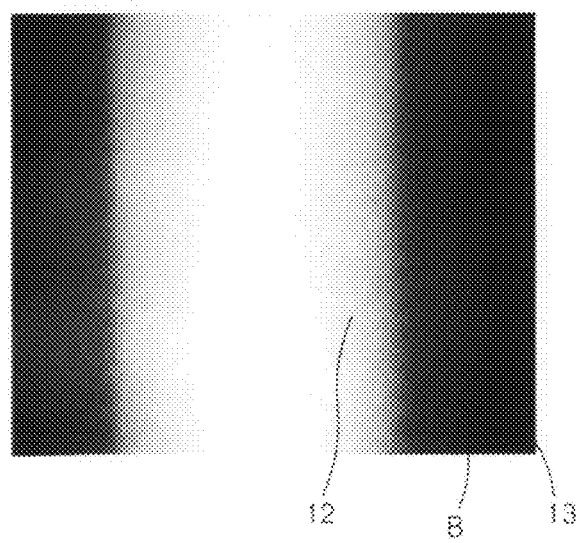
Figure 5C:
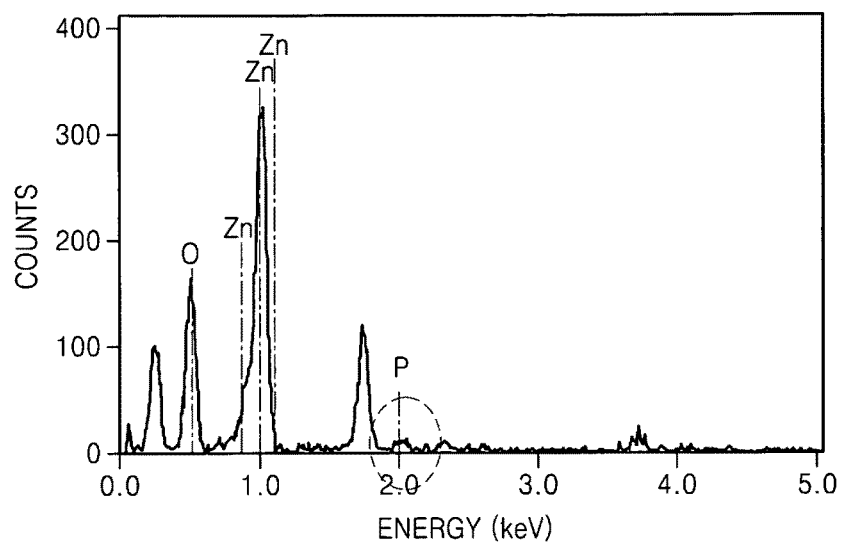
FIG. 5C is a graph showing an energy dispersive x-ray (EDX) analysis result of the p-n Zn oxide nanowire illustrated in FIGS. 5A and 5B.

FIGS. 5A and 5B are transmission electron microscopic (TEM) images of portions of a p-n Zn oxide nanowire. Referring to FIG. 5A, a region B including bumps and/or dots may be on a surface of the Zn oxide nanowire. Referring to FIG. 5B, the region B may be a region in which p-type Zn oxide 13 is on a surface of a Zn oxide nanowire 12. An energy dispersive x-ray (EDX) analysis may be performed in order to determine whether P deposited to form the p-type Zn oxide 13 exists and a result of an EDX analysis is illustrated in FIG. 5C. Referring to FIG. 5C, Zn and oxygen (O) are detected and a peak corresponding to P is detected, which may demonstrate that P exists in the region B of the surface of the Zn oxide nanowire 12.

FIG. 6 is a cross-sectional diagram of a solar cell using p-n Zn oxide nanowires W according to example embodiments. Referring to FIG. 6, a Zn oxide layer 11 may be on a substrate 10 and a Zn oxide nanowire 12 may be on the Zn oxide layer 11. P-type Zn oxide 13 may be on a surface of the Zn oxide nanowire 12 in the form of bumps or dots and together may be the p-n Zn oxide nanowire W. The p-type Zn oxide 13 may be Zn oxide doped with P. A P layer 14 may be on the p-n Zn oxide nanowire W and an electrode (not shown), for example a transparent electrode including indium tin oxide (ITO), may be on the P layer 14. Due to a wide surface area and a p-n junction in an inorganic crystalline structure, stability and/or efficiency may be improved in comparison to a general nanowire solar cell using an organic material.

According to example embodiments, a p-n Zn oxide nanowire that is applicable to various fields may be provided. A stable p-n Zn oxide nanowire may be easily manufactured by using an economical method.

While example embodiments have been particularly shown and described, it will be understood by one of ordinary skill in the art that variations in form and detail may be made therein without departing from the spirit and scope of the claims. Descriptions of features or aspects within each embodiment should typically be considered as available for other similar features or aspects in other embodiments.

What is claimed is:

1. A p-n zinc (Zn) oxide nanowire, comprising:
    an n-type Zn oxide nanowire; and
    p-type Zn oxide created on a surface of the n-type Zn oxide nanowire thus forming a p-n Zn oxide nanowire having a core-shell structure, the p-type Zn oxide being in a form of at least one of discontinuous bumps and dots along the surface of the n-type Zn oxide nanowire, the p-type Zn oxide including Zn oxide doped with phosphorus (P).

2. The p-n Zn oxide nanowire of claim 1, further comprising:
    a substrate; and
    a Zn oxide layer on the substrate, the n-type Zn oxide nanowire on and perpendicular to the Zn oxide layer.

3. The p-n Zn oxide nanowire of claim 1, further comprising a P layer on the n-type Zn oxide nanowire and the p-type Zn oxide.

4. The p-n Zn oxide nanowire of claim 3, further comprising a transparent electrode on the P layer.

5. The p-n Zn oxide nanowire of claim 4, wherein the transparent electrode includes indium tin oxide (ITO).

6. A nanowire solar cell including the p-n Zn oxide nanowire of claim 5.

7. The p-n Zn oxide nanowire of claim 1, wherein the n-type Zn oxide nanowire is the core and the p-type Zn oxide is the shell.

8. A method of manufacturing a p-n zinc (Zn) oxide nanowire, the method comprising:
    forming a Zn oxide layer on a substrate;
    forming a n-type Zn oxide nanowire on the Zn oxide layer; and
    forming p-type Zn oxide on a surface of the Zn oxide nanowire thus forming a p-n Zn oxide nanowire having a core-shell structure, the p-type Zn oxide being in a form of at least one of discontinuous bumps and dots along the surface of the n-type Zn oxide nanowire, the p-type Zn oxide including Zn oxide doped with phosphorous (P).

9. The method of claim 8, further comprising:
    forming a seed layer on the substrate by coating Zn on the substrate; and
    forming the Zn oxide layer using the seed layer.

10. The method of claim 9, wherein the n-type Zn oxide nanowire and the p-type Zn oxide are formed by using a thermal chemical vapor deposition (TCVD) method.

11. The method of claim 9, wherein the forming of the Zn oxide layer includes performing at least one heat treatment on the seed layer.

12. The method of claim 8, wherein the forming of the n-type Zn oxide nanowire includes growing the n-type Zn oxide nanowire on a surface of the Zn oxide layer in a vertical direction by heating a Zn oxide source in a chamber.

13. The method of claim 12, wherein the forming of the p-type Zn oxide on the surface of the n-type Zn oxide nanowire includes heating a phosphorus (P) source in the chamber to dope the surface of the Zn oxide nanowire with P.

14. The method of claim 13, wherein the P source is heated by a heating unit that is independent from a heating unit of the chamber.

15. The method of claim 13, wherein the P source includes $P_2O_5$.

16. The method of claim 12, wherein the Zn oxide source is 10 mm to 50 mm from the substrate.

17. The method of claim 12, wherein the Zn oxide source is ZnO:C in a 1:1 ratio.

* * * * *